US010157903B2

(12) United States Patent
Higashi

(10) Patent No.: US 10,157,903 B2
(45) Date of Patent: Dec. 18, 2018

(54) SEMICONDUCTOR DEVICE

(71) Applicant: LAPIS SEMICONDUCTOR CO., LTD., Kanagawa (JP)

(72) Inventor: Masahiko Higashi, Kanagawa (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 0 days.

(21) Appl. No.: 15/683,883

(22) Filed: Aug. 23, 2017

(65) Prior Publication Data

US 2018/0061821 A1    Mar. 1, 2018

(30) Foreign Application Priority Data

Aug. 31, 2016    (JP) .................... 2016-169911

(51) Int. Cl.
| | | |
|---|---|---|
| *H02H 3/22* | (2006.01) | |
| *H01L 27/02* | (2006.01) | |
| *H01L 23/58* | (2006.01) | |
| *H01L 29/66* | (2006.01) | |
| *H01L 29/872* | (2006.01) | |

(52) U.S. Cl.
CPC ........ *H01L 27/0248* (2013.01); *H01L 23/585* (2013.01); *H01L 29/66143* (2013.01); *H01L 29/872* (2013.01); *H01L 2224/83385* (2013.01); *H01L 2924/0002* (2013.01)

(58) Field of Classification Search
CPC ......... H01L 2924/00; H01L 2924/0002; H01L 27/0255; H01L 27/0259; H01L 23/60
See application file for complete search history.

(56) References Cited

U.S. PATENT DOCUMENTS

| 5,714,784 A * | 2/1998 | Ker ..................... H01L 27/0251 |
| | | 257/360 |
| 6,097,066 A * | 8/2000 | Lee ..................... H01L 27/0288 |
| | | 257/355 |
| 6,750,517 B1 * | 6/2004 | Ker ....................... H01L 23/585 |
| | | 257/355 |
| 7,179,691 B1 * | 2/2007 | Lee ..................... H01L 27/0255 |
| | | 438/135 |
| 9,876,006 B2 * | 1/2018 | Tai ..................... H01L 27/0277 |
| 2009/0040670 A1 * | 2/2009 | Van Camp ......... H01L 27/0255 |
| | | 361/56 |

(Continued)

FOREIGN PATENT DOCUMENTS

JP    2013535823 A    9/2013

*Primary Examiner* — Joseph C Nicely
*Assistant Examiner* — David Goodwin
(74) *Attorney, Agent, or Firm* — Volentine, Whitt & Francos, PLLC

(57) ABSTRACT

A semiconductor device that improves the discharge capacity with respect to ESD without increasing the surface area of the semiconductor device includes a first conductive portion including plural portions, each of the plural portions having a first type of conductivity, and each of the plural portions extending in a first direction and being arranged in parallel at a distance from each other in a second direction that intersects the first direction; and a second conductive portion including an island portion provided between the respective plural portions of the first conductive portion and extending in the first direction, the second conductive portion having a second type of conductivity that is different from the first type of conductivity.

7 Claims, 16 Drawing Sheets

(56) References Cited

U.S. PATENT DOCUMENTS

| | | | |
|---|---|---|---|
| 2011/0215410 A1* | 9/2011 | Chen | H01L 27/0277 257/360 |
| 2011/0248383 A1* | 10/2011 | Ren | H01L 27/0259 257/577 |
| 2012/0043643 A1* | 2/2012 | Chang | H01L 27/0259 257/557 |
| 2012/0044732 A1* | 2/2012 | Li | H01L 21/76283 363/147 |
| 2012/0200964 A1* | 8/2012 | Van Camp | H01L 27/0255 361/56 |
| 2013/0082353 A1* | 4/2013 | Kuo | H01L 27/0259 257/591 |
| 2016/0035713 A1* | 2/2016 | Iwamoto | H01L 27/0207 257/506 |

* cited by examiner

SEMICONDUCTOR DEVICE

CROSS-REFERENCE TO RELATED APPLICATION

This application is based on and claims priority under 35 USC 119 from Japanese Patent Application No. 2016-169911 filed on Aug. 31, 2016, the disclosure of which is incorporated by reference herein.

BACKGROUND

Technical Field

The present disclosure relates to a semiconductor device.

Related Art

Semiconductor devices may either be damaged or may malfunction by Electrostatic Discharge (ESD). In order to prevent the above, diodes, for example, are used as protective elements to protect circuits that need protection from ESD.

A Schottky-barrier diode in which an outer periphery of a positive-type well region is surrounded by a positive-type contact region, and the positive-type contact region is further surrounded by a negative-type contact region is described, for example, in Japan Patent Application Publication (JP-A) No. 2013-535823 as an example of a diode structure.

In recent years, in conjunction with ever-increasing semiconductor integrated circuit densification, there is a demand for the surface area of protective elements to be reduced. On the other hand, there is also a demand for the protective performance provided by these protective elements to be improved by increasing the discharge capacity of the protective elements with respect to ESD. However, in a protective element, there is a trade-off between reduced surface area and improved discharge capacity, and it is difficult to achieve both of these simultaneously.

SUMMARY

The present disclosure provides a semiconductor device that may improve the discharge capacity with respect to ESD, without increasing the surface area of the semiconductor device.

A first aspect of the present disclosure is a semiconductor device, including: a first conductive portion including plural portions, each of the plural portions having a first type of conductivity, and each of the plural portions extending in a first direction and being arranged in parallel at a distance from each other in a second direction that intersects the first direction; and a second conductive portion including an island portion provided between the respective plural portions of the first conductive portion and extending in the first direction, the second conductive portion having a second type of conductivity that is different from the first type of conductivity.

A second aspect of the present disclosure is a semiconductor device, including: a first protective element including a first conductive portion including plural portions, each of the plural portions having a first type of conductivity, and each of the plural portions extending in a first direction and being arranged in parallel at a distance from each other in a second direction that intersects the first direction, and a second conductive portion including an island portion provided between the respective plural portions of the first conductive portion and extending in the first direction, the second conductive portion having a second type of conductivity that is different from the first type of conductivity; and a second protective element including, a third conductive portion including plural portions, each of the plural portions having the second type of conductivity, and each of the plural portions extending in the first direction and being arranged in parallel at a distance from each other in the second direction, and a fourth conductive portion including an island portion provided between the respective plural portions of the third conductive portion and extending in the first direction, the fourth conductive portion having the first type of conductivity.

According to the semiconductor device according to the above-described aspects, the present disclosure may improve the discharge capacity with respect to ESD without increasing the surface area of the semiconductor device.

BRIEF DESCRIPTION OF THE DRAWINGS

Exemplary embodiments will be described in detail based on the following figures, wherein.

DETAILED DESCRIPTION

Hereinafter, exemplary embodiments of the present disclosure will be described with reference with the drawings. Note that the same reference symbols are used in each of the drawings for elements or portions that are mutually same or equivalent, and any repeated description thereof may be omitted.

First Exemplary Embodiment

Figure 1A:
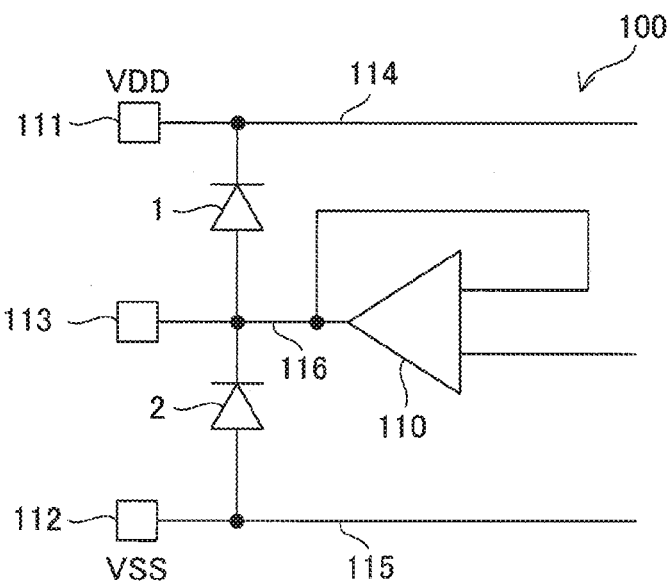
FIG. 1A illustrates an example of use of a protective element according to an exemplary embodiment of the present disclosure, and is a circuit diagram illustrating an example of a partial structure of an integrated circuit that includes a protective element 1.

FIG. 1A illustrates an example of use of protective elements 1 and 2 that serves as a semiconductor device according to an exemplary embodiment of the present disclosure, and is a circuit diagram illustrating an example of a partial structure of an integrated circuit 100 that includes the protective elements 1 and 2. The integrated circuit 100 includes the protective elements 1 and 2, an output circuit 110 and electrode pads 111, 112, and 113. The output circuit 110 is an example of a circuit that requires protection and is protected by the protective elements 1 and 2. The electrode pad 111 is a power supply terminal that supplies power supply voltage VDD to each circuit within the integrated circuit 100 including the output circuit 110, and is connected via a power supply line 114 to each circuit within the integrated circuit 100 including the output circuit 110. The electrode pad 112 is a ground terminal that supplies ground voltage VSS to each circuit within the integrated circuit 100 including the output circuit 110, and is connected via a ground line 115 to each circuit within the integrated circuit 100 including the output circuit 110. The electrode pad 113 is a signal output terminal that outputs to the outside of the integrated circuit 100 an output signal that is output from the output circuit 110, and is connected via a signal line 116 to an output terminal of the output circuit 110.

Figure 1B:
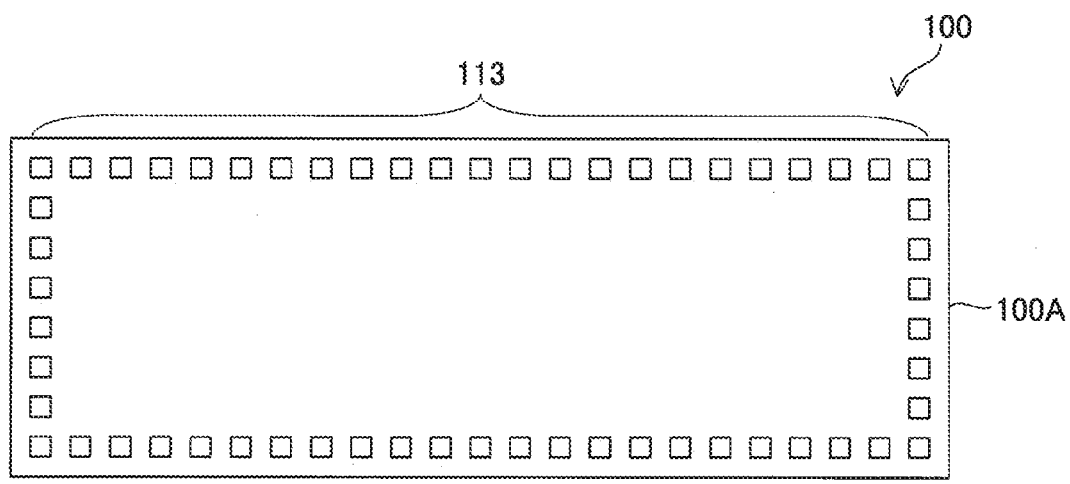
FIG. 1B is a plan view illustrating the structure of a semiconductor chip housing an integrated circuit according to an exemplary embodiment of the present disclosure.

The integrated circuit 100 may configure, for example, a liquid crystal display (LCD) driver and, in this case, plural output circuits 110 and electrode pads 113 are provided in the integrated circuit 100 so as to correspond to the plural pixels in the LCD. FIG. 1B is a plan view illustrating an example of the structure of a semiconductor chip 100A that houses the integrated circuit 100 in the aforementioned case in which the integrated circuit 100 forms an LCD driver. The external configuration of the semiconductor chip 100A is, for example, rectangular, and electrode pads are arranged along each side of the semiconductor chip 100A. The plural electrode pads 113 that are connected respectively to the plural output circuits 110 are disposed, for example, along one side of the semiconductor chip 100A, and the protective elements 1 and 2 are disposed directly under each one of the plural electrode pads 113.

In a case in which the number of LCD pixels is increased, it is necessary to correspondingly increase the number of output circuits 110 that are mounted on the integrated circuit 100. Moreover, together with this increase in the number of output circuits 110, it is also necessary for the number of protective elements 1 and 2 to be increased. In a case in which it is not possible to increase the surface area of the semiconductor chip 100A in spite of the number of output circuits 110 and protective elements 1 and 2 being increased, the pitch between adjacent electrode pads 13 needs to be reduced, and, together with this, the surface area of the protective elements 1 and 2 also needs to be reduced. However, generally, in a case in which the surface area of the protective elements is decreased, the discharge capacity of the protective elements decreases, and the protection capability may also decrease.

The protective elements 1 and 2 according to the present exemplary embodiment may improve the discharge capacity without increasing the surface area. In other words, the surface area of the protective elements 1 and 2 may be decreased while the discharge capacity thereof is maintained. The following description centers mainly on the protective element 1. Note that the output circuit 110 described hereinbelow is an example of a circuit requiring protection and is protected by the protective elements 1 and 2. However, the circuit requiring protection may be any type of circuit. Moreover, the protective elements 1 and 2 may be mounted on an integrated circuit that is used for applications other than an LCD driver.

Figure 2A:
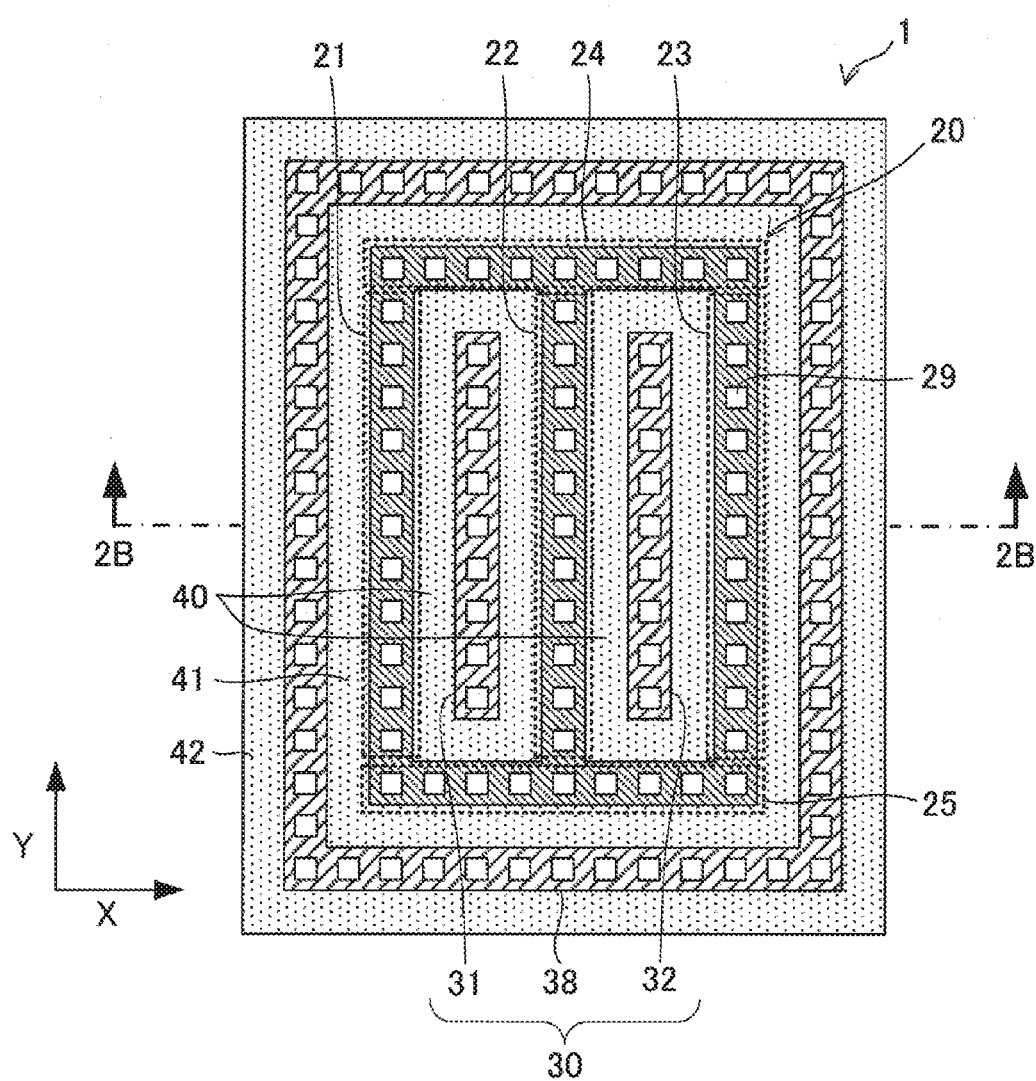
FIG. 2A is a plan view illustrating the structure of a protective element according to an exemplary embodiment of the present disclosure.
Figure 2B:
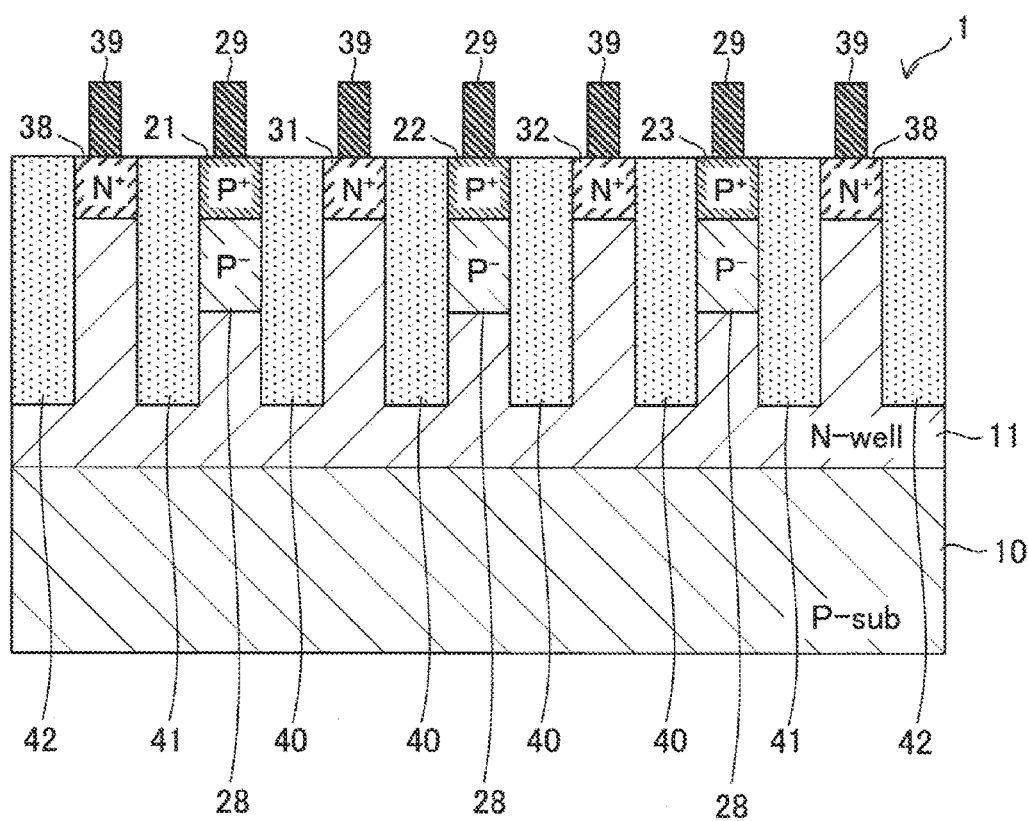
FIG. 2B is a cross-sectional view taken along a line 2B-2B in FIG. 2A.

FIG. 2A is a plan view illustrating the structure of the protective element 1 that serves as a semiconductor device according to an exemplary embodiment of the present disclosure, and FIG. 2B is a cross-sectional view taken along a line 2B-2B in FIG. 2A. The protective element 1 has an N-type conductivity N-well 11 that is provided at a surface layer portion of a P-type conductivity silicon substrate 10. The protective element 1 has a first conductive portion 20 having P-type conductivity that functions as an anode formed inside the N-well 11, and a second conductive portion 30 having N-type conductivity that functions as a cathode. Note that it is also possible to employ a structure in which the first conductive portion 20 and the second conductive portion 30 are provided in the surface layer portion of an N-type silicon substrate.

The first conductive portion 20 includes a first portion 21, a second portion 22, and a third portion 23 that each extend in a Y direction illustrated in FIG. 2A. The first portion 21, the second portion 22, and the third portion 23 are arranged in parallel with a distance from each other in an X direction, as illustrated in FIG. 2A.

The first conductive portion 20 further includes a fourth portion 24 and a fifth portion 25 that each extend in the X direction in FIG. 2A. The fourth portion 24 is connected to one end of each of the first portion 21, the second portion 22, and the third portion 23, and the fifth portion 25 is connected to another end of each of the first portion 21, the second portion 22, and the third portion 23. In this way, the first conductive portion 20 has a double rectangle configuration in which two rectangular rings are placed side-by-side with each other.

The first portion 21 through the fifth portion 25 of the first conductive portion 20 are formed by P-type semiconductor that each have a comparatively high impurity concentration, and are connected to the N-well 11 via P-type low concentration areas 28 that each have a comparatively low impurity concentration. In this way, by interposing the low concentration areas 28, which each have a comparatively low impurity concentration, between the first portion 21 through the fifth portion 25 of the first conductive portion 20, which each have a comparatively high impurity concentration, and the N-well, it is possible to guarantee a predetermined breakdown voltage in the protective element 1. Moreover, the first portion 21 through the fifth portion 25 of the first conductive portion 20 are also connected to a common signal line 116 (see FIG. 1A) that is provided in a wiring layer (not illustrated) via plural contacts 29.

The second conductive portion 30 includes a first island portion 31 and a second island portion 32 that each extend in the Y direction in FIG. 2A. The first island portion 31 is provided between the first portion 21 and the second portion 22 of the first conductive portion 20. Namely, the first island portion 31 is sandwiched between the first portion 21 and the second portion 22 of the first conductive portion 20 so as to face both of these portions. The first island portion 31 is insulated and separated from the first conductive portion 20 by an insulator 40 that surrounds an outer periphery of the first island portion 31.

The second island portion 32 of the second conductive portion 30 is provided between the second portion 22 and the third portion 23 of the first conductive portion 20. Namely, the second island portion 32 is sandwiched between the second portion 22 and the third portion 23 of the first conductive portion 20 so as to face both of these portions. The second island portion 31 is insulated and separated from the first conductive portion 20 by another insulator 40 that surrounds an outer periphery of the second island portion 32.

The second conductive portion 30 further includes a ring portion 38 having a ring-shaped configuration that surrounds an outer periphery of the first conductive portion 20. The ring portion 38 has a rectangular ring-shaped configuration having portions that extend in the Y direction in FIG. 2A, and portions that extend in the X direction thereof. The portions of the ring portion 38 that extend in the Y direction face the first portion 21 and the third portion 23 of the first conductive portion 20, while the portions of the ring portion 38 that extend in the X direction face the fourth portion 24 and the fifth portion 25 of the first conductive portion 20. The ring portion 38 is insulated and separated from the first conductive portion 20 by an insulator 41 that surrounds the outer periphery of the first conductive portion 20. The ring portion 38 is also insulated and separated from other elements (not illustrated in the drawings) provided around the periphery of the protective element 1 by an insulator 42 that surrounds an outer periphery of the ring portion 38. The insulators 40, 41, and 42 may be formed using, for example, Shallow Trench Isolation (STI) technology.

The first island portion 31, the second island portion 32, and the ring portion 38 of the second conductive portion 30 are each formed by N-type semiconductors having a comparatively high impurity concentration, and are connected to the N-well 11 which has a comparatively low impurity concentration. In addition, the first island portion 31, the second island portion 32, and the ring portion 38 of the second conductive portion 30 are also connected to the common power supply line 114 (see FIG. 1A) that is provided in a wiring layer (not illustrated) via plural contacts 39.

As is described above, in the protective element 1, the second conductive portion 30, which functions as a cathode, has a double island structure formed by the first island portion 31 and the second island portion 32 that are positioned apart from each other. Further, the first conductive portion 20, which functions as an anode, has the first portion 21 through the fifth portion 25 that form two rings that respectively surround the first island portion 31 and the second island portion 32 of the second conductive portion 30. The second conductive portion 30 further includes the ring portion 38 that surrounds the outer periphery of the first conductive portion 20.

Figure 3A:
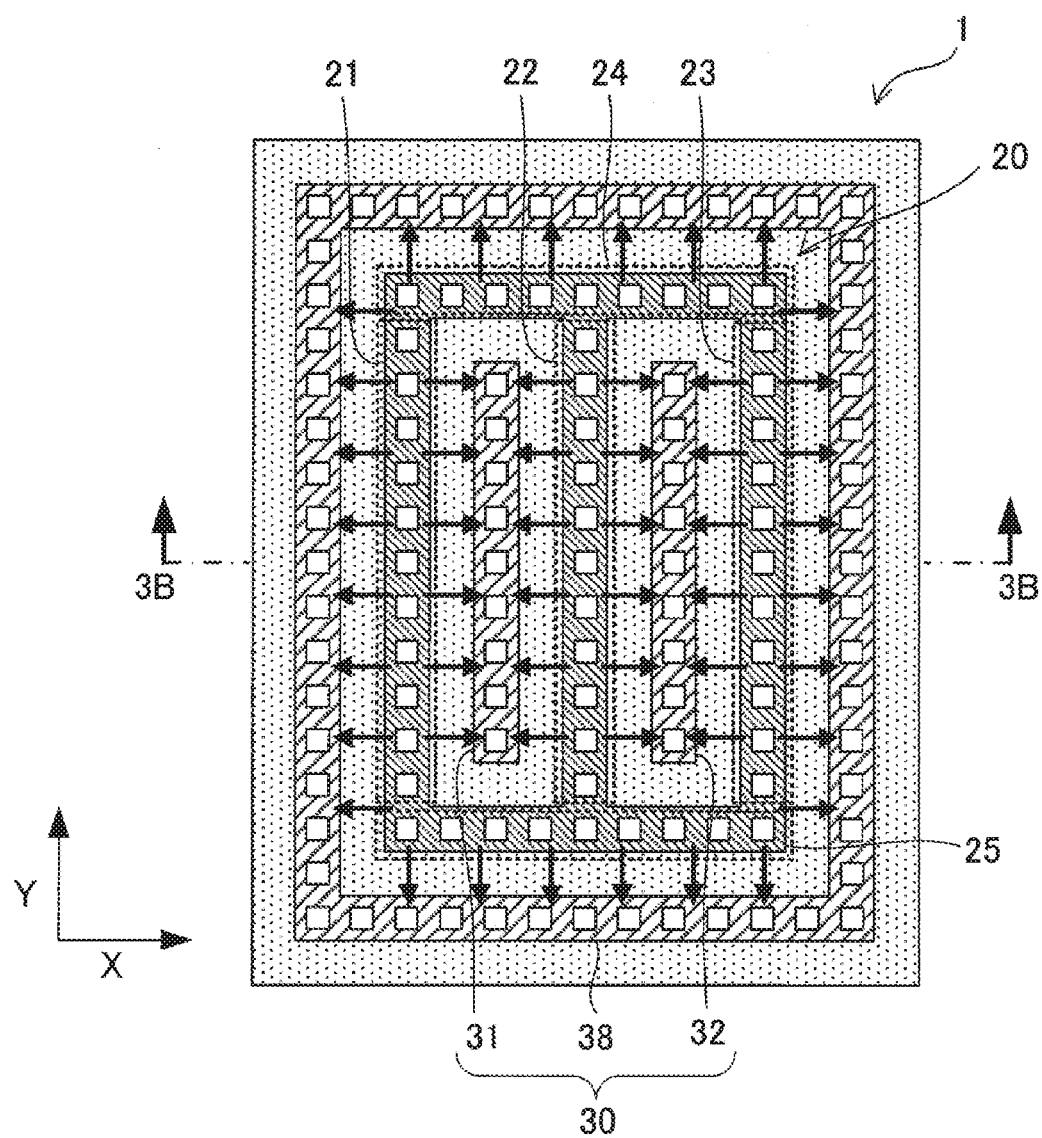
FIG. 3A is a plan view illustrating a path of discharge current during an electrostatic discharge in a protective element according to an exemplary embodiment of the present disclosure.
Figure 3B:
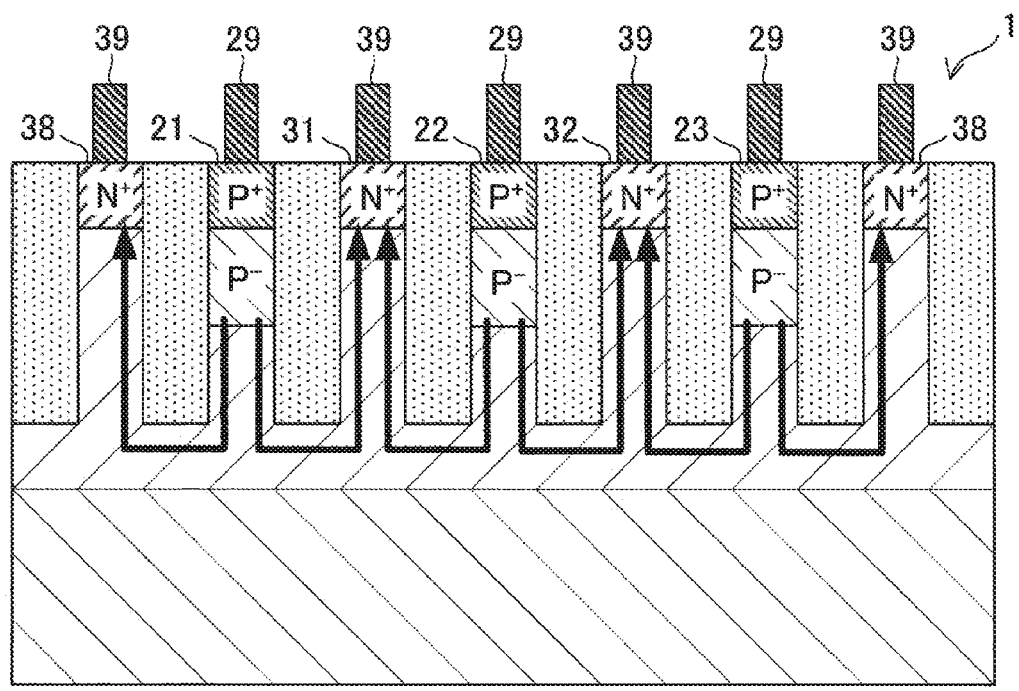
FIG. 3B is a cross-sectional view taken along a line 3B-3B in FIG. 3A.

FIG. 3A is a plan view illustrating a discharge current path when electrostatic discharges are discharged in a case in which the second conductive portion 30 that functions as a cathode has a potential lower than the first conductive portion 20 that functions as an anode. FIG. 3B is a cross-sectional view taken along a line 3B-3B in FIG. 3A. In a case in which the second conductive portion 30 has a lower potential that the first conductive portion 20, the discharge current of electrostatic discharges flows in the directions indicated by the arrows in FIG. 3A and FIG. 3B (namely, discharge current flows from the first conductive portion 20 towards the second conductive portion 30). As is illustrated in FIG. 3B, the discharge current flows along an outer edge of the insulators 40 and 41 that are provided between each portion of the first conductive portion 20 and each portion of the second conductive portion 30.

In the protective element 1 according to the present exemplary embodiment, as described above, the first island portions 31 of the second conductive portion 30, which extend in the Y direction, are provided between the first portions 21 and the second portions 22 of the first conductive portion 20, which extend in the Y direction. In addition, the second island portions 32 of the second conductive portion 30, which extend in the Y direction, are provided between the second portions 22 and the third portions 23 of the first conductive portion 20 which also extend in the Y direction. In this way, as a result of P-type semiconductors and N-type semiconductors that extend in the same direction as each other being arranged alternatingly, the area efficiency of the current path of the discharge current during an electrostatic discharge may be improved, and the discharge capacity of the protective element 1 may be increased. Moreover, in the protective element 1 according to the present exemplary embodiment, the first conductive portion 20 further includes the fourth portion 24 and the fifth portion 25 which extend in the X direction, while the second conductive portion 30 further includes the rectangular ring-shaped ring portion 38 which surrounds the outer periphery of the first conductive portion 20. As a consequence, the area efficiency of the current path of the discharge current during an electrostatic discharge may be further improved.

Namely, according to the protective element 1 according to the present exemplary embodiment, a current path heading from the first portion 21 of the first conductive portion 20 towards the first island portion 31 and the ring portion 38 of the second conductive portion 30 is formed running in the Y direction. Moreover, a current path heading from the second portion 22 of the first conductive portion 20 towards the first island portion 31 and the second island portion 32 of the second conductive portion 30 is also formed running in the Y direction. In addition, a current path heading from the third portion 23 of the first conductive portion 20 towards the second island portion 32 and the ring portion 38 of the second conductive portion 30 is also formed running in the Y direction. Furthermore, a current path heading from the fourth portion 24 and the fifth portion 25 of the first conductive portion 20 towards the ring portion 38 of the second conductive portion 30 is formed running in the X direction.

In this manner, according to the protective element 1 according to the present exemplary embodiment, because it is possible to improve the area efficiency of the current path of the discharge current during an electrostatic discharge, the present exemplary embodiment may improve the discharge capacity compared to a conventional structure while suppressing any increase in the surface area of the protective element 1. In other words, the surface area of the protective element 1 may be decreased while the discharge capacity is maintained.

Figure 4A:
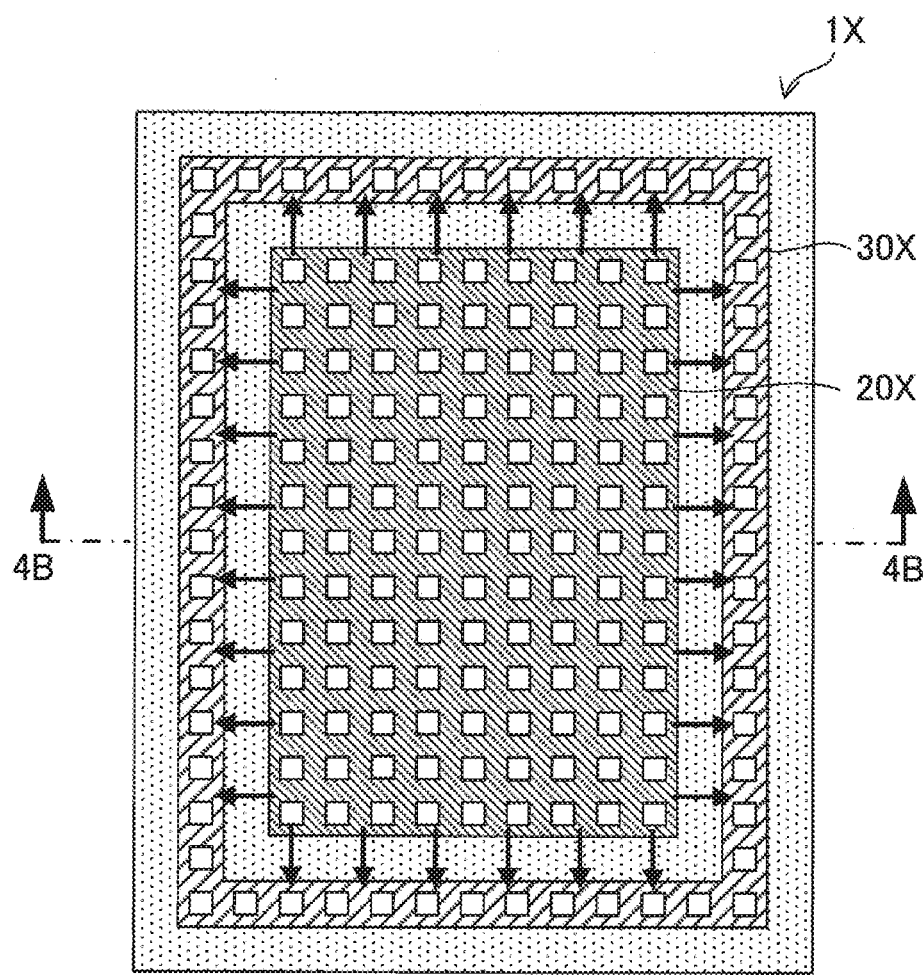
FIG. 4A is a plan view illustrating the structure of a protective element according to a first comparative example.
Figure 4B:
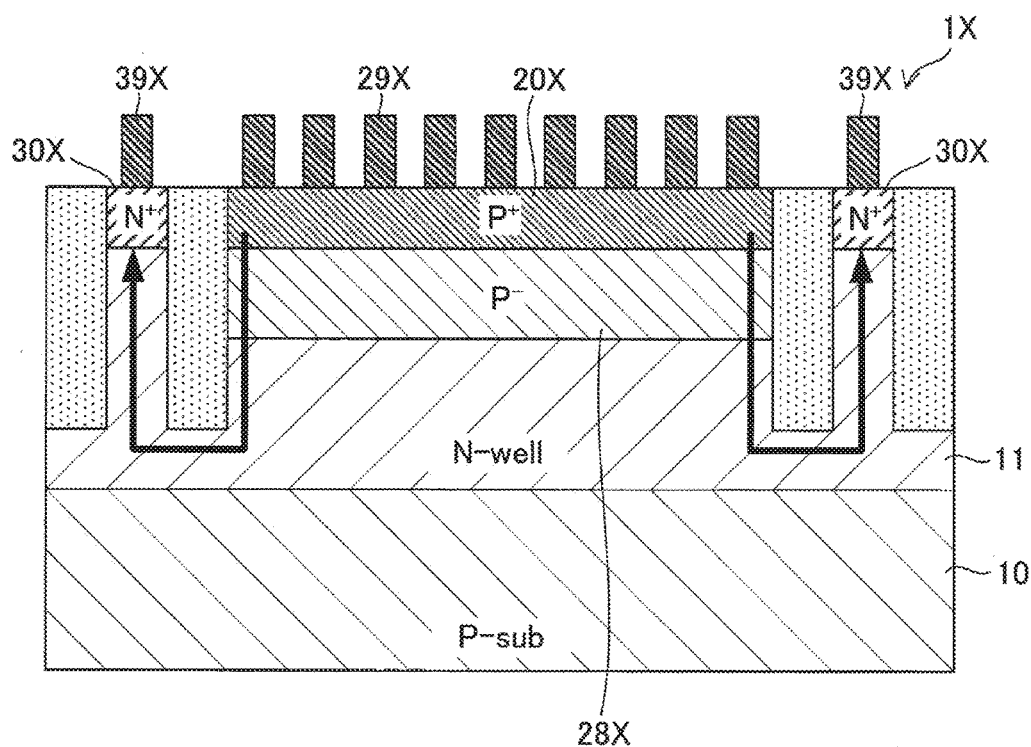
FIG. 4B is a cross-sectional view taken along a line 4B-4B in FIG. 4A.

FIG. 4A is a plan view illustrating the structure of a protective element 1X according to a first comparative example, and FIG. 4B is a cross-sectional view taken along a line 4B-4B in FIG. 4A. In FIG. 4A and FIG. 4B, discharge current paths of the electrostatic discharges are indicated by arrows, in a case in which a second conductive portion 30X that functions as a cathode has a low-potential than a first conductive portion 20X that functions as an anode.

In the protective element 1X according to the first comparative example, the first conductive portion 20X that functions as an anode, has a rectangular configuration, while the second conductive portion 30X that functions as a cathode, has a rectangular ring configuration that surrounds an outer periphery of the first conductive portion 20X. The second conductive portion 30X is insulated and separated from the first conductive portion 20X by an insulator that surrounds an outer periphery of the first conductive portion 20X. The first conductive portion 20X is formed by a P-type semiconductor having a comparatively high impurity concentration, and is connected to the N-well 11 via a P-type low concentration area 28X that has a comparatively low impurity concentration. The second conductive portion 30X is formed by an N-type semiconductor having a comparatively high impurity concentration, and is connected to the N-well 11 that has a comparatively low impurity concentration. Plural contacts 29X are provided on a surface of the first conductive portion 20X such that they are spread substantially uniformly over the entire surface of the first conductive portion 20X. Plural contacts 39X are provided on a surface of the second conductive portion 30X. According to the protective element 1X of the first comparative example, as is illustrated in FIG. 4A, during an electrostatic discharge current paths are formed along all four sides of the first conductive portion 20X.

Figure 5:
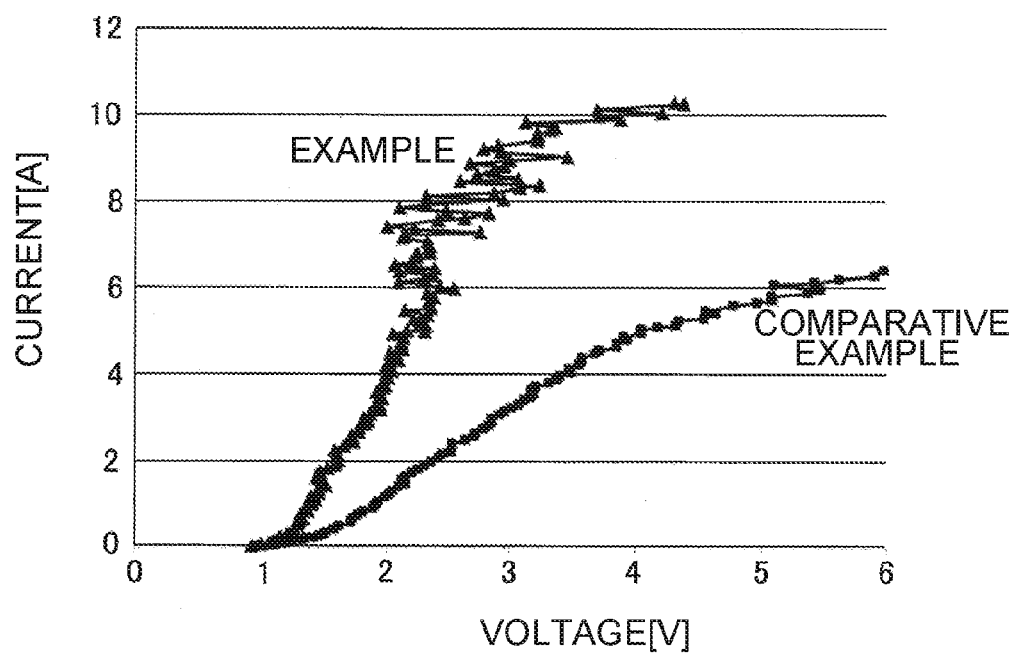
FIG. 5 is a graph illustrating current-voltage characteristics for each of a protective element according to an exemplary embodiment of the present disclosure and the protective element according to the first comparative example as obtained via a TLP measurement method.

FIG. 5 is a graph illustrating current-voltage characteristics for each of the protective element 1 according to an exemplary embodiment of the present disclosure and the protective element 1X according to the first comparative example, as obtained by a TLP measurement method. Note that the surface areas of the protective element 1 and the protective element 1X are the same as each other. A TLP measurement method is a method in which the characteristics of a protective element are examined using a rectangular wave obtained by discharging an electrical charge stored in a coaxial cable. In FIG. 5, the horizontal axis illustrates the voltage between an anode and a cathode of a protective element, while the vertical axis illustrates a current flowing in the protective element. When a comparison is made using the same voltage, it can be confirmed that the current flowing in the protective element 1 according to the exemplary embodiment of the present disclosure is conspicuously larger than the current flowing in the protective element 1X according to the first comparative example. This indicates that the protective element 1 according to the exemplary embodiment of the present disclosure has a greater discharge capacity than the protective element 1X according to the first comparative example, and provides a better protection performance when protecting a circuit that requires protection from ESD.

Figure 6A:
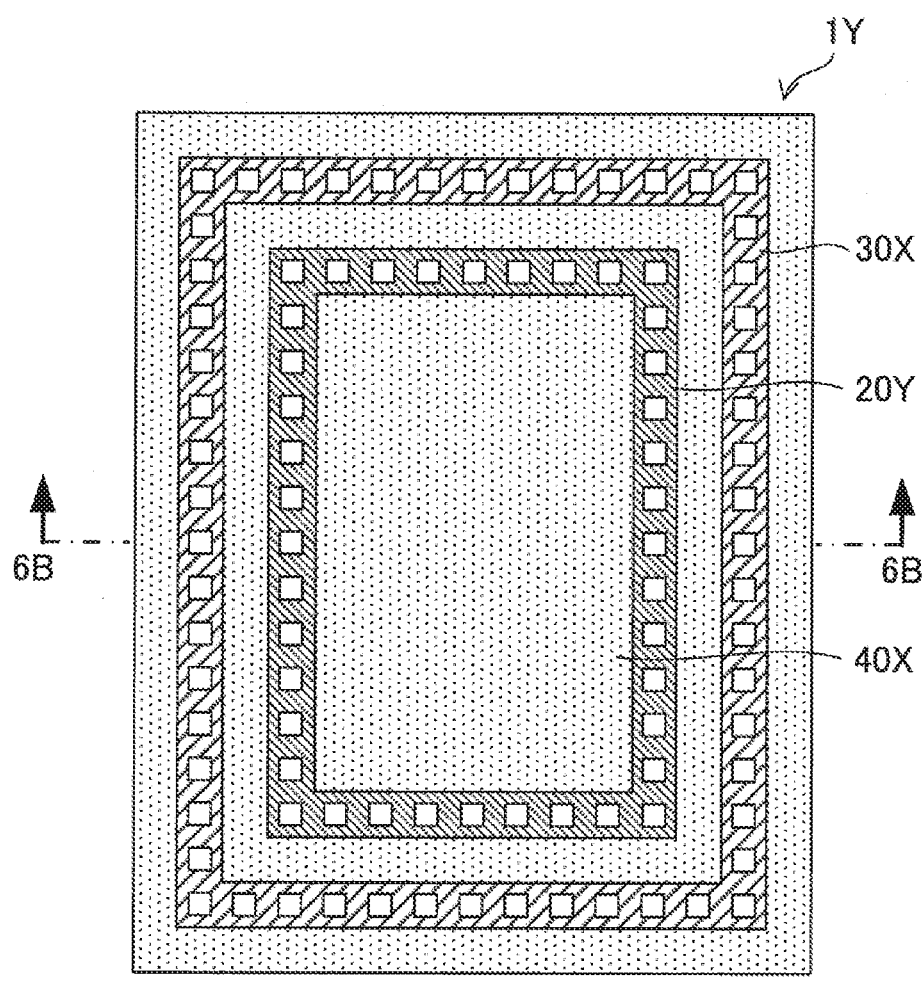
FIG. 6A is a plan view illustrating the structure of a protective element according to a second comparative example.
Figure 6B:
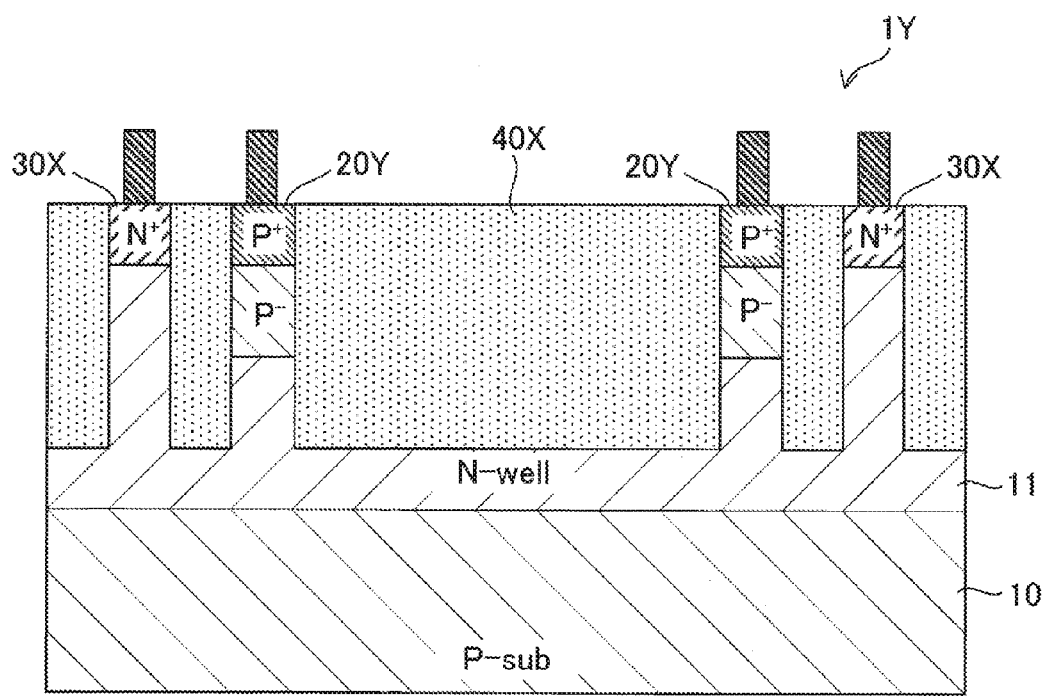
FIG. 6B is a cross-sectional view taken along a line 6B-6B in FIG. 6A.

FIG. 6A is a plan view illustrating the structure of a protective element 1Y according to a second comparative example, while FIG. 6B is a cross-sectional view taken along a line 6B-6B in FIG. 6A. The protective element 1Y according to the second comparative example differs from the protective element 1X according to the first comparative example in that a first conductive portion 20Y has a structure in which an insulator 40X is disposed in a central portion of the first conductive portion 20X of the protective element 1X according to the first comparative example. Namely, in the protective element 1Y according to the second comparative example, the first conductive portion 20Y has a rectangular ring-shaped configuration, and the surface area of the first conductive portion 20Y is smaller than the surface area of the first conductive portion 20X of the protective element 1X according to the first comparative example.

In a case in which current-voltage characteristics for the protective element 1Y according to the second exemplary embodiment were acquired by a TLP measurement method, substantially the same characteristics were obtained as those obtained from the protective element 1X according to the first comparative example. From these results, in the protective element 1X according to the first comparative example, it could be understood that the central portion of the first conductive portion 20X makes essentially no effects to the discharge, and the only the outer peripheral portions effects the discharge. From the above, by efficiently deploying structural portions in which P-type semiconductors that form anodes of a protective element and N-type semiconductors that form cathodes of the protective element are facing each other, the discharge capacity may be improved without increasing in the surface area.

In the above, a structure in which the protective element 1 is provided between the signal line 116 and the power supply line 114, has been described. However, the protective element 2 (see FIG. 1) may be provided between the ground line 115 and the signal line 116 with the same type of structure as the protective element 1.

Figure 7A:
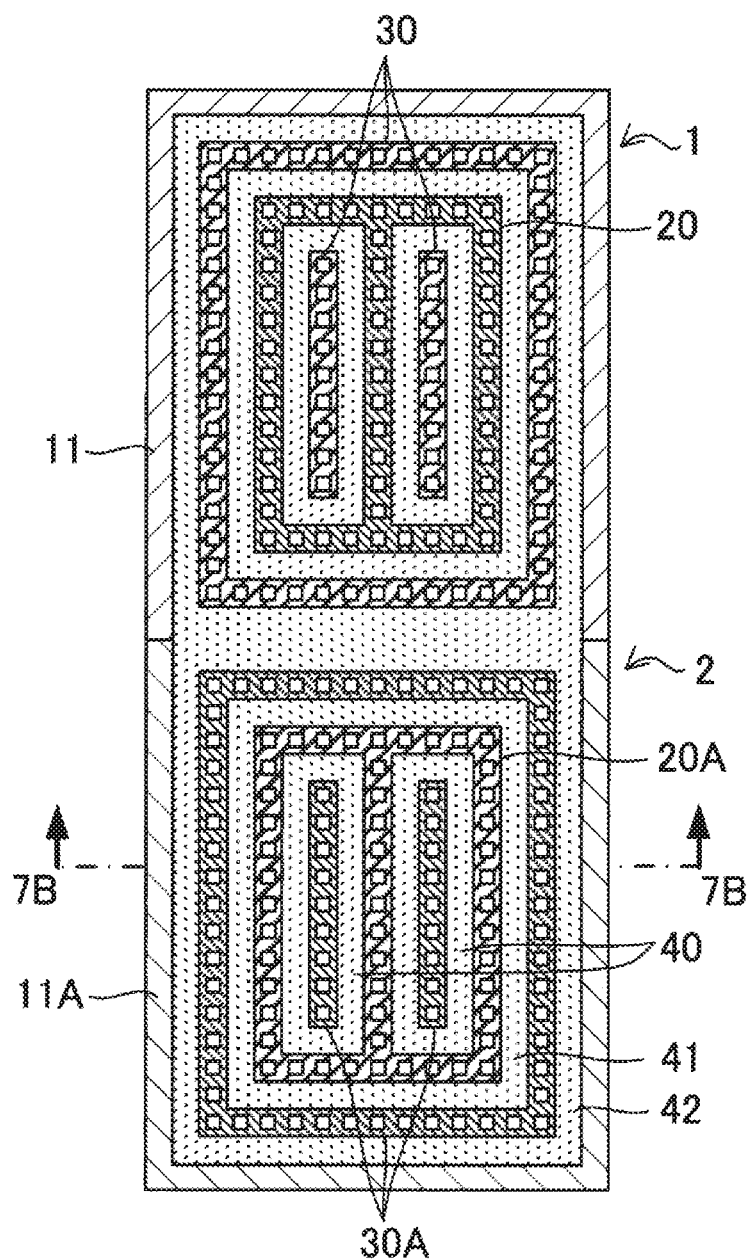
FIG. 7A is a plan view illustrating a layout of a pair of protective elements according to an exemplary embodiment of the present disclosure.
Figure 7B:
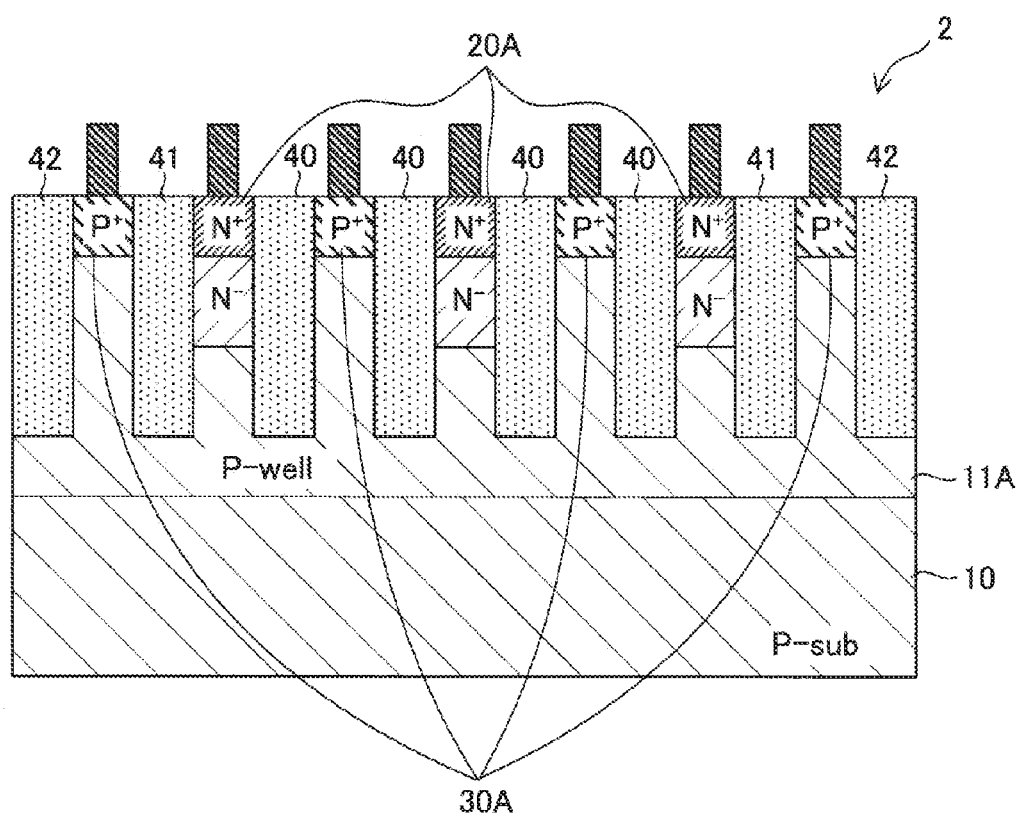
FIG. 7B is a cross-sectional view taken along a line 7B-7B in FIG. 7A.

FIG. 7A is a plan view illustrating an example of the layout of a pair of protective elements in the form of the protective elements 1 and 2. FIG. 7B is a cross-sectional view taken along a line 7B-7B in FIG. 7A, and illustrates the cross-sectional structure of the protective element 2. As is illustrated in FIG. 7A, the protective elements 1 and 2 may be placed adjacently to each other. Moreover, as is illustrated in FIG. 7B, the structure of the protective element 2 may be formed by swapping the P-type semiconductor areas and the N-type semiconductor areas with each other.

Namely, the protective element 2 has a P-type conductivity P-well 11A that is formed in a surface layer portion of a silicon substrate 10. The protective element 2 is provided with a first conductive portion 20A having N-type conductivity that functions as a cathode formed inside the P-well 11A, and a second conductive portion 30A having P-type conductivity that functions as an anode. The first conductive portion 20A of the protective element 2 has the same configuration as the first conductive portion 20 of the protective element 1, while the second conductive portion 30A of the protective element 2 has the same configuration as the second conductive portion 30 of the protective element 1. Namely, in the protective element 2, the second conductive portion 30A, which functions as an anode, has a double island structure formed by two island portions which are disposed apart from each other, while the first conductive portion 20A, which functions as a cathode, is positioned so as to form two rings that respectively surround the mutually separated two island portions of the second conductive portion 30A. The second conductive portion 30A further includes a ring portion that surrounds the outer periphery of the first conductive portion 20A. As well as the above-described structure, in the same way as in the protective element 1, the protective element 2 may improve the discharge capacity with respect to ESD without increasing in the surface area.

Second Exemplary Embodiment

Figure 8:
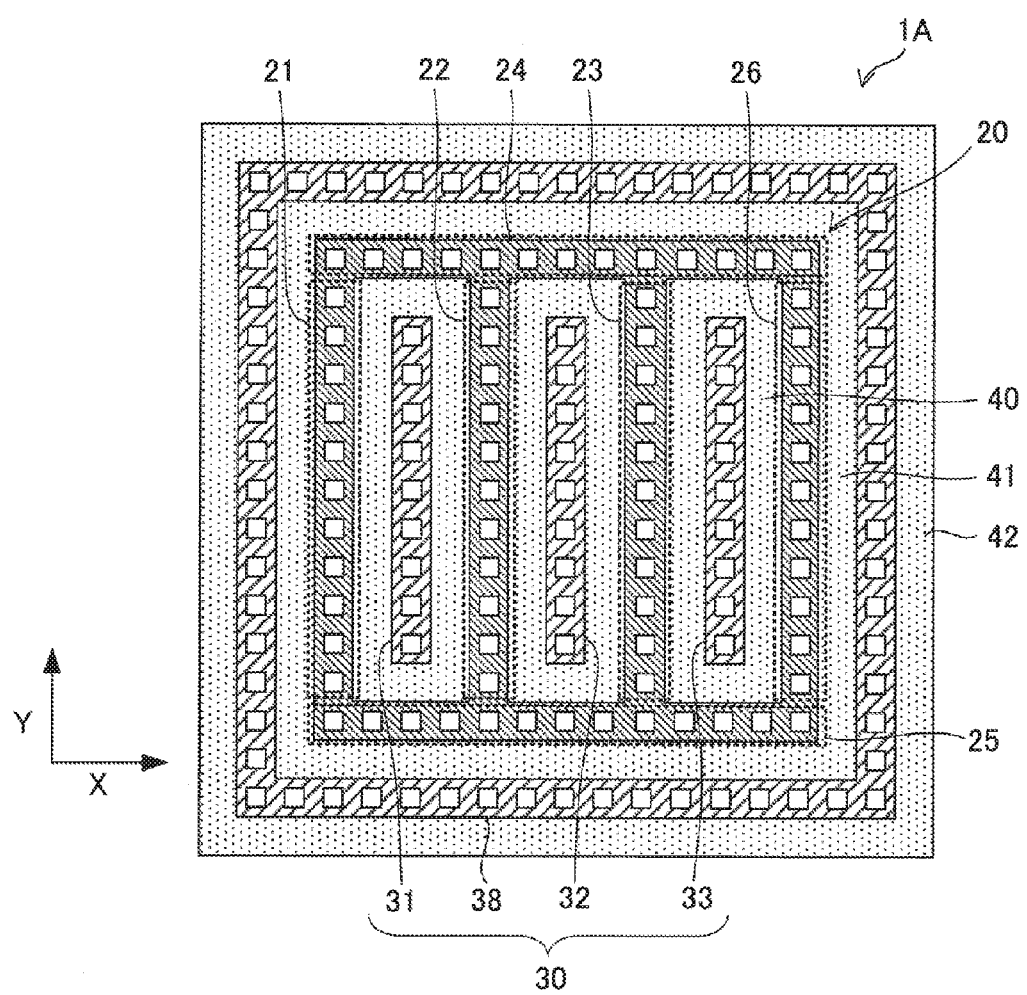
FIG. 8 is a plan view illustrating the structure of a protective element according to alternative exemplary embodiment of the present disclosure.

FIG. 8 is a plan view illustrating the structure of a protective element 1A which is serving as a semiconductor device according to a second exemplary embodiment of the present disclosure. In the protective element 1A, the configurations of the first conductive portion 20 and the second conductive portion 30 are different from those in the protective element 1 according to the first exemplary embodiment. Specifically, the protective element 1A differs from the protective element 1 according to the first exemplary embodiment in that the first conductive portion 20 further includes a sixth portion 26, and the second conductive portion 30 further includes a third island portion 33.

Namely, in the protective element 1A, the first conductive portion 20 includes the first portion 21, the second portion 22, the third portion 23, and the sixth portion 26 that each extend in the Y direction illustrated in FIG. 8. The first portion 21, the second portion 22, the third portion 23, and the sixth portion 26 are arranged in parallel with a distance from each other in the X direction illustrated in FIG. 8. The fourth portion 24 of the first conductive portion 20 that extends in the X direction in FIG. 8 is connected to one end of each of the first portion 21, the second portion 22, the third portion 23, and the sixth portion 26. The fifth portion 25 of the first conductive portion 20 that extends in the X direction in FIG. 8 is connected to another end of each of the first portion 21, the second portion 22, the third portion 23, and the sixth portion 26. In this way, in the protective element 1A, the first conductive portion 20 has a triple rectangle configuration in which three rectangular rings are placed in a row side-by-side with each other.

The third island portion 33 of the second conductive portion 30 is provided between the third portion 23 and the sixth portion 26 of the first conductive portion 20. Namely, the third island portion 33 of the second conductive portion 30 is sandwiched between the third portion 23 and the sixth portion 26 of the first conductive portion 20 so as to face both of these portions. The third island portion 33 of the second conductive portion 30 is insulated and separated from the first conductive portion 20 by the insulator 40 that surrounds an outer periphery of the third island portion 33. The second conductive portion 30 further includes the ring portion 38 having a ring-shaped configuration that surrounds the outer periphery of the first conductive portion 20.

In this way, in the protective element 1A, the second conductive portion 30, which functions as a cathode, includes a triple island structure formed by the first island portion 31, the second island portion 32, and the third island portion 33 that are positioned apart from each other. Further, the first conductive portion 20, which functions as an anode, includes the first portion 21 through the sixth portion 26 that form three rings that respectively surround the first island portion 31, the second island portion 32, and the third island portion 33 of the second conductive portion 30. The second conductive portion 30 further includes the ring portion 38 that surrounds the outer periphery of the first conductive portion 20.

In the protective element 1A that includes the above-described structure, as the protective element 1, the protective element 1A may improve the discharge capacity with respect to ESD without increasing the surface area.

Third Exemplary Embodiment

Figure 9:
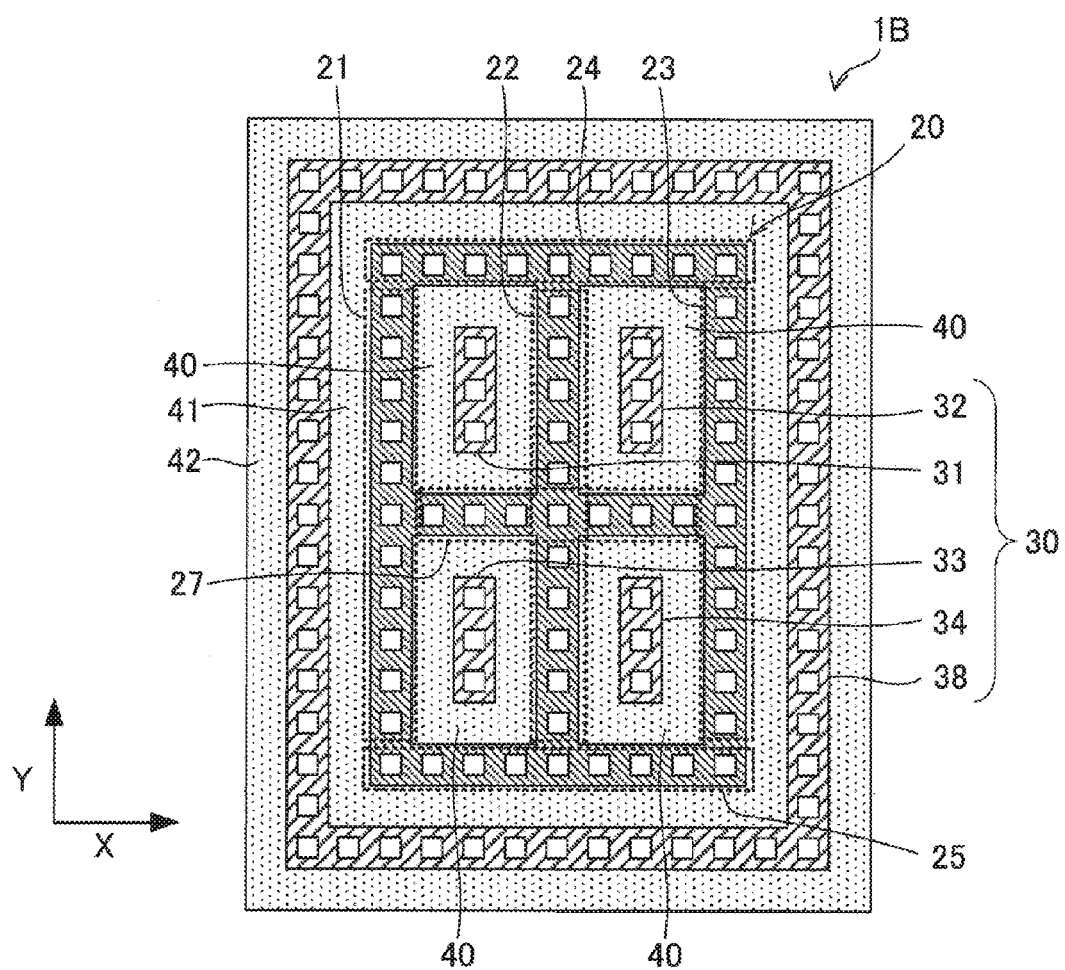
FIG. 9 is a plan view illustrating the structure of a protective element according to alternative exemplary embodiment of the present disclosure.

FIG. 9 is a plan view illustrating the structure of a protective element 1B which is serving as a semiconductor device according to a third exemplary embodiment of the present disclosure. In the protective element 1B, the configurations of the first conductive portion 20 and the second conductive portion 30 are different from those in the protective element 1 according to the first exemplary embodiment.

In the protective element 1B, the first conductive portion 20 has a grid shaped configuration configured by the first portion 21, the second portion 22, and the third portion 23, which extend in the Y direction, and the fourth portion 24, the fifth portion 25, and a seventh portion 27, which extend in the X direction which is orthogonal to the Y direction. In other words, in the protective element 1B, the first conductive portion 20 has a quadruple rectangle configuration in which four rectangular rings are placed side-by-side with each other horizontally and vertically.

The second conductive portion 30 has the first island portion 31, the second island portion 32, the third island portion 33, and a fourth island portion 34 that are provided on an inner side of the respective grids in the gird shaped configuration of the first conductive portion 20. The first island portion 31 through the fourth island portion 34 of the second conductive portion 30 are respectively insulated and separated from the first conductive portion 20 by insulators 40 that surround an outer periphery of each island portion. The second conductive portion 30 further includes the ring portion 38 having a ring-shaped configuration that surrounds the outer periphery of the first conductive portion 20.

In the protective element 1B that includes the above-described structure, as the protective element 1, the protective element 1B may improve the discharge capacity with respect to ESD without increasing the surface area.

Fourth Exemplary Embodiment

Figure 10:
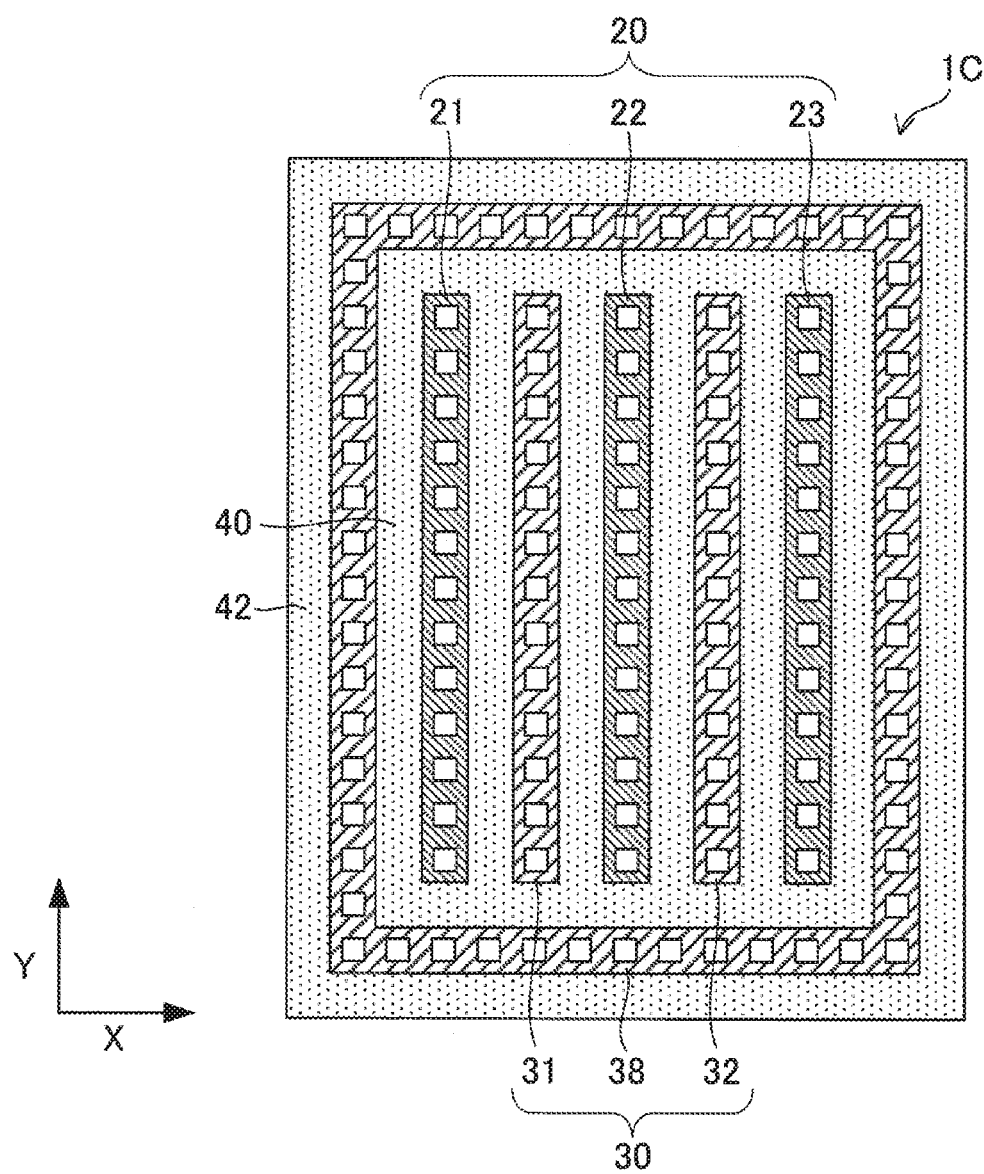
FIG. 10 is a plan view illustrating the structure of a protective element according to alternative exemplary embodiment of the present disclosure.

FIG. 10 is a plan view illustrating the structure of a protective element 1C which is serving as a semiconductor device according to a fourth exemplary embodiment of the present disclosure. In the protective element 1C, the configurations of the first conductive portion 20 and the second conductive portion 30 are different from those in the protective element 1 according to the first exemplary embodiment. Specifically, in the protective element 1C, the first conductive portion 20 does not include portions that extend in the X direction, and the first island portion 31 and the second island portion 32 that form the second conductive portion 30 are the same length as the first portion 21 through the third portion 23 of the first conductive portion 20.

Namely, in the protective element 1C, the first conductive portion 20 has the first portion 21, the second portion 22, and the third portion 23 that each extend in the Y direction. The first portion 21, the second portion 22, and the third portion 23 are arranged in parallel and at a distance from each other in the X direction. In the protective element 1C, the second conductive portion 30 has the first island portion 31 and the second island portion 32 that extend in the Y direction. The first island portion 31 is provided between the first portion 21 and the second portion 22 of the first conductive portion 20. The second island portion 32 is provided between the second portion 22 and the third portion 23 of the first conductive portion 20. The second conductive portion 30 further includes the ring portion 38 having a ring-shaped configuration that surrounds the outer periphery of the first conductive portion 20. The ring portion 38 has a rectangular ring-shaped configuration having portions that extend in the Y direction in FIG. 2A, and portions that extend in the X direction thereof.

In the protective element 1C that includes the above-described structure, as in the same way as in the protective element 1, the protective element 1C may improve the discharge capacity with respect to ESD without increasing the surface area.

Fifth Exemplary Embodiment

Figure 11:
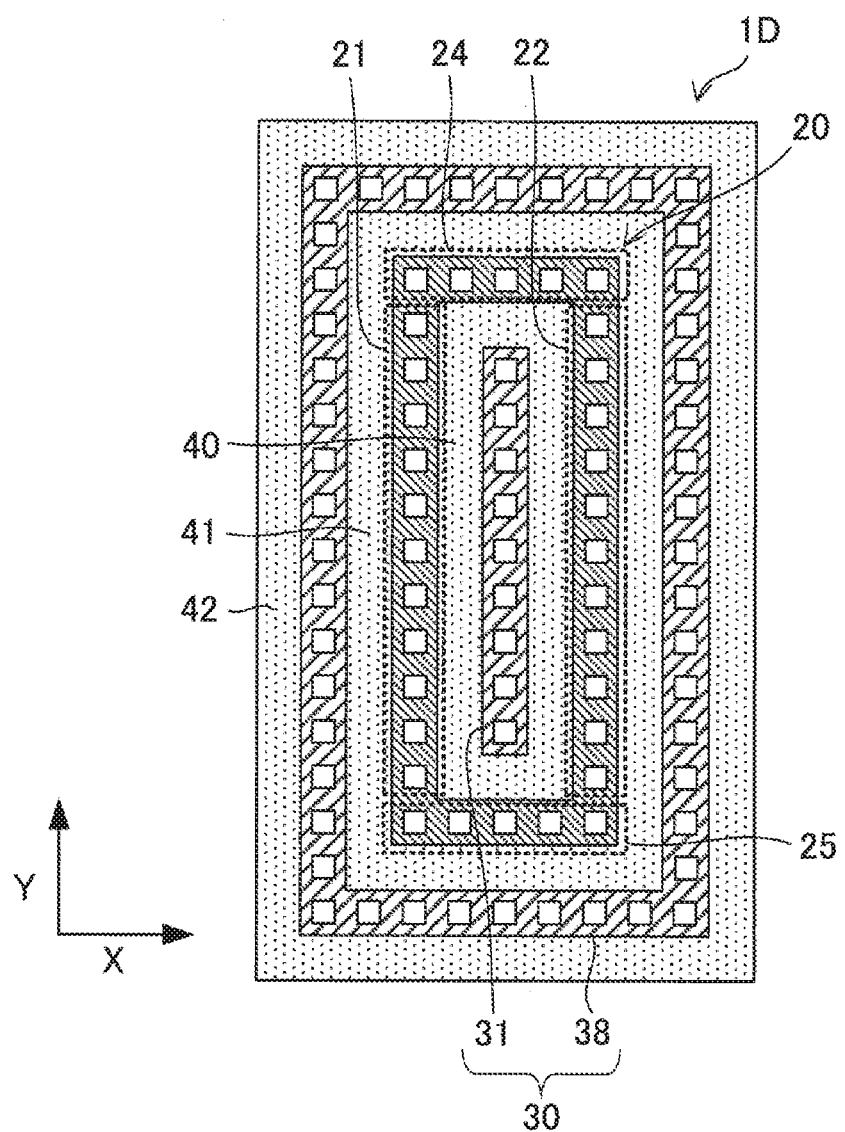
FIG. 11 is a plan view illustrating the structure of a protective element according to alternative exemplary embodiment of the present disclosure.

FIG. 11 is a plan view illustrating the structure of a protective element 1D which is serving as a semiconductor device according to a fifth exemplary embodiment of the present disclosure. In the protective element 1D, the configurations of the first conductive portion 20 and the second conductive portion 30 are different from those in the protective element 1 according to the first exemplary embodiment.

In the protective element 1D, the first conductive portion 20 has the first portion 21 and the second portion 22 that each extend in the Y direction in FIG. 11. The first portion 21 and the second portion 22 are arranged in parallel and at a distance from each other in the X direction in FIG. 11. The fourth portion 24 of the first conductive portion 20 which extends in the X direction in FIG. 11 is connected to the one end of each of the first portion 21 and the second portion 22. The fifth portion 25 of the first conductive portion 20 which extends in the X direction in FIG. 11 is connected to the other end of each of the first portion 21 and the second portion 22. In this way, in the protective element 1D, the first conductive portion 20 has a single rectangular ring-shaped configuration.

The second conductive portion 30 has a first island portion 31 that extends in the Y direction in FIG. 11. The first island portion 31 is provided between the first portion 21 and the second portion 22 of the first conductive portion 20. Namely, the first island portion 31 is sandwiched between the first portion 21 and the second portion 22 of the first conductive portion 20 so as to face both of these portions. The first island portion 31 is insulated and separated from the first conductive portion 20 by the insulator 40 that surrounds the outer periphery of the first island portion 31. The second conductive portion 30 further includes the ring portion 38 having a ring-shaped configuration that surrounds the outer periphery of the first conductive portion 20.

In the protective element 1D that includes the above-described structure, as in the same way as in the protective element 1, the protective element 1D may improve the discharge capacity with respect to ESD without increasing the surface area.

The structures of semiconductor devices according to exemplary embodiments of the present disclosure have been described and illustrated above. However, the present disclosure is not limited to the structures of the semiconductor devices according to each of the above-described exemplary embodiments. Namely, it is sufficient for a semiconductor device according to the present disclosure to include: a first conductive portion including a plural portions, each of the plural portions having a first type of conductivity, and each of the plural portions extending in a first direction and being arranged in parallel at a distance from each other in a second direction that intersects the first direction; and a second conductive portion including an island portion provided between the respective plural portions of the first conductive portion and extending in the first direction, the second conductive portion having a second type of conductivity that is different from the first type of conductivity. Note that various suitable modifications may be made to the structures of the semiconductor devices according to the above-described first through fifth exemplary embodiments.

What is claimed is:

1. A semiconductor device, comprising:
a first conductive portion, formed at a surface of the semiconductor device, including a plurality of portions, each of the plurality of portions having a first type of conductivity, and each of the plurality of portions extending in a first direction and being arranged in parallel at a distance from each other in a second direction that intersects the first direction;
a first low concentration layer formed below the first conductive portion with respect to the surface of the semiconductor device, the first low concentration layer having the first type of conductivity and having a lower impurity concentration than the first conductive portion;
a second conductive portion, formed at the surface of the semiconductor device, including an island portion provided between respective ones of the plurality of portions of the first conductive portion and extending in the first direction, the second conductive portion having a second type of conductivity that is different from the first type of conductivity;
a second low concentration layer formed below the second conductive portion with respect to the surface of the semiconductor device, the second low concentration layer having the second type of conductivity and having a comparatively lower impurity concentration than the second conductive portion; and
an insulator formed between the first conductive portion and the second conductive portion, the insulator extending further below the first low concentration layer and into the second low concentration layer from the surface of the semiconductor device.

2. The semiconductor device according to claim 1, wherein
the plurality of portions of the first conductive portion includes at least three portions, and
the island portion of the second conductive portion includes a plurality of island portions respectively provided between each of the at least three portions.

3. The semiconductor device according to claim 1, wherein the second conductive portion further includes a ring portion having the second type of conductivity and having a ring-shaped pattern that surrounds the first conductive portion.

4. The semiconductor device according to claim 3, wherein the ring portion has a rectangular ring-shaped pattern that includes portions that extend in the first direction and portions that extend in the second direction.

5. The semiconductor device according to claim 4, wherein the first conductive portion further includes a portion, having the first type of conductivity, that extends in the second direction at an inner side of the ring portion and that faces a portion from among the portions of the ring portion which extends in the second direction.

6. The semiconductor device according to claim 1, wherein
the first conductive portion has a grid pattern formed by at least three portions from among the plurality of portions of the first conductive portion, and by another plurality of portions from among the plurality of portions of the first conductive portion that intersect with each of the at least three portions; and
the island portion of the second conductive portion includes a plurality of island portions that are respectively provided at an inner side of each grid in the grid pattern of the first conductive portion.

7. A semiconductor device, comprising:
a first protective element including
- a first conductive portion, formed at a surface of the semiconductor device, including a plurality of portions, each of the plurality of portions having a first type of conductivity, and each of the plurality of portions extending in a first direction and being arranged in parallel at a distance from each other in a second direction that intersects the first direction,
- a first low concentration layer formed below the first conductive portion with respect to the surface of the semiconductor device, the first low concentration layer having the first type of conductivity and having a lower impurity concentration than the first conductive portion,
- a second conductive portion, formed at the surface of the semiconductor device, including an island portion provided between respective ones of the plurality of portions of the first conductive portion and extending in the first direction, the second conductive portion having a second type of conductivity that is different from the first type of conductivity, and
- a second low concentration layer formed below the second conductive portion with respect to the surface of the semiconductor device, the second low concentration layer having the second type of conductivity and having a lower impurity concentration than the second conductive portion;

a second protective element including
- a third conductive portion, formed at the surface of the semiconductor device, including a plurality of portions, each of the plurality of portions of the third conductive portion having the second type of conductivity, and each of the plurality of portions of the third conductive portion extending in the first direction and being arranged in parallel at a distance from each other in the second direction,
- a third low concentration layer formed below the third conductive portion with respect to the surface of the semiconductor device, the third low concentration layer having the second type of conductivity and having a lower impurity concentration than the third conductive portion,
- a fourth conductive portion, formed at the surface of the semiconductor device, including an island portion provided between respective ones of the plurality of portions of the third conductive portion and extending in the first direction, the fourth conductive portion having the first type of conductivity, and
- a fourth low concentration layer formed below the fourth conductive portion with respect to the surface of the semiconductor device, the fourth low concentration layer having the first type of conductivity and having a lower impurity concentration than the fourth conductive portion; and an insulator formed between the first conductive portion and the second conductive portion and between the third conductive portion and the fourth conductive portion, the insulator extending below the first low concentration layer and the third low concentration layer, and into the second low concentration layer and the fourth low concentration layer, from the surface of the semiconductor device.

* * * * *